United States Patent [19]

Togei

[11] Patent Number: 4,571,607
[45] Date of Patent: Feb. 18, 1986

[54] SEMICONDUCTOR DEVICE

[75] Inventor: Ryoiku Togei, Machida, Japan

[73] Assignee: Fujitsu Limited, Kawasaki, Japan

[21] Appl. No.: 573,601

[22] Filed: Jan. 26, 1984

Related U.S. Application Data

[63] Continuation of Ser. No. 220,969, Dec. 29, 1980.

[30] Foreign Application Priority Data

Dec. 27, 1979 [JP] Japan .................................. 54-170782

[51] Int. Cl.⁴ .......................................... H01L 29/78
[52] U.S. Cl. .................................. 357/23.6; 357/23.11;
357/23.4; 357/23.1; 357/30; 357/45
[58] Field of Search ..................... 357/23.1, 23.4, 23.9,
357/23.12, 23.11, 30, 30 H, 45, 23.6

[56] References Cited

U.S. PATENT DOCUMENTS

| | | | |
|---|---|---|---|
| 3,882,531 | 5/1975 | Michon | 357/23 C |
| 3,893,146 | 7/1975 | Heeren | 357/23 C |
| 3,979,734 | 9/1976 | Pricer et al. | |
| 3,988,613 | 10/1976 | Brown | 357/23 C |
| 4,329,704 | 5/1982 | Sakurai | 357/23 C |
| 4,373,248 | 2/1983 | McElroy | 357/23 C |

OTHER PUBLICATIONS

*Electronics*, vol. 51, No. 26 (1972, pp. 31–32.
Richman, Paul *MOS Field-Effect Transistors and Integrated Circuits*, Wiley-Interscience, N.Y., pp. 46–53.
Bulk Access-Surface Storage Memory Cells; W. P. Noble, Jr.; *IBM Technical Disclosure Bulletin*, vol. 16, No. 10, Mar. 1974, pp. 3170–3172.
Simple Cell Design for Dynamic RAM Scraps Capacitor; 8032 *Electronics*, vol. 51, No. 26 (1978.12), pp. 31–32.
Three-Terminal Charge-Injection Device, Paul G. A. Jespers and Jean Marie Millet, *IEEE Journal of Solid-State Circuits*, vol. SC-11, No. 1, Feb., 1976, pp. 133–139.

*Primary Examiner*—Martin H. Edlow
*Attorney, Agent, or Firm*—Staas & Halsey

[57] ABSTRACT

The capacity of a capacitor constituted by a metal-insulator-semiconductor layer configuration varies depending on the quantity of electric charge staying in the neighborhood of the interface between the insulating layer and the semiconductor layer. Because interleaving of a thin semiconductor layer between the insulating layer and the semiconductor layer to form a P-N junction therebetween is effective to confine some quantity of electric charge in the thin semiconductor layer, the capacity of the capacitor can be regulated. When the quantity of electric charge confined in the thin semiconductor layer is given in the form of an electric pulse signal, the signal can be memorized in the form of capacity. A layer configuration of a conductor, an insulator and a semiconductor, including a P-N junction therein fabricated on a substrate with which the layers are isolated, functions as a memory cell which consists of only one capacitor and, which requires an extremely small area of a chip, and which is involved with non destructive read out. The same layer configuration is effective to function as a photoelectro transducer or an image sensor unit, when the conductor layer is fabricated with a transparent conductor.

22 Claims, 7 Drawing Figures

SEMICONDUCTOR DEVICE

This is a continuation of application Ser. No. 220,969, filed 12-29-80.

BACKGROUND OF THE INVENTION

This invention relates to a semiconductor device, and more particularly to a semiconductor device which is allowed to function as a random access memory (RAM) cell or a photoelectro transducer.

The random access memory cells are customarily classified into two categories including the static type and the dynamic type. The former type is generally based on the concept of a flip-flop circuit and is inevitably involved with the drawbacks inherent to the flip-flop circuit. Namely, a fairly large area of a semiconductor chip is required for production of a memory cell, and more electric power is required to sustain information in a memory cell. The latter type is generally a combination of gate transistors and capacitors. Since the capacitors formed in semiconductor chips are more or less volatile, any of the dynamic type memory cells requires a refreshment circuit, albeit less electric power is required to sustain information. Further, the information memorized in a dynamic memory cell is destroyed when it is read out. In other words, the dynamic memory cells are involved with destructive read out.

SUMMARY OF THE INVENTION

An object of this invention is to provide a semiconductor device which functions as a random access memory cell based on a novel concept different from either of the above mentioned two categories of the conventional random access memory cells. Namely, the novel memory cell in accordance with this invention consists of only one capacitor of which the capacity varies depending on whether a bit of information is memorized or not. Therefore, the memory cell requires a fairly small area of a semiconductor chip for production and involves non-destructive read out.

Another object of this invention is to provide a semiconductor device which functions as a photoelectro transducer unit, particularly an image sensor unit, which is based on the same concept as the above mentioned memory cell.

A further object of this invention is to provide a random access memory device which utilizes a plurality of memory cells as mentioned above.

A still further object of this invention is to provide an image sensor which utilizes a plurality of photoelectro transducer units or image sensor units as mentioned above.

To attain the first one of the above mentioned objects, a semiconductor device in accordance with this invention is provided with a layer configuration which comprises a semiconductor region having one conductivity to form a charge source region, and which is to be applied with address signals, a semiconductor region to form a charge storage region which is formed on a selected area of the above mentioned charge source region which is insulated from or floating on a substrate produced of a semiconductor or insulator and which has a conductivity type different from that of the charge source region to form a P-N junction between this charge storage region and the above mentioned charge source region, an insulator or dielectric layer which is formed on the charge storage region, the charge source region and the substrate, and a conductor region which is formed on a selected area of the above mentioned dielectric layer at least on the above mentioned charge storage region and which is to be applied with data signals.

In the above mentioned layer configuration, a capacitor is constituted between the charge source region and the conductor region. Since the charge storage region is interleaved between the charge source region and the dielectric layer to allow some quantity of electric charge to be stored in the charge storage region, the capacity of the capacitor varies depending on whether or not the charge storage region is filled with charge. This is a performance to be utilized for memorizing electric signals. In other words, when an electric pulse signal which has the polarity to pass through the P-N junction is applied to the charge source region, some quantity of electric charge is stored and confined in the charge storage region, resultantly decreasing the capacity of the capacitor. This change in capacity is utilized as the parameter to memorize information. Not only minority carriers but also majority carriers can be stored in the charge storage region, depending on specific conditions. When reading the information, an electric voltage pulse signal with the polarity reverse to that which was employed for writing information is applied to the conductor region. Depending on whether information is written or not, the pulse signal causes a current or no current.

To attain the second one of the above mentioned objects, a photoelectro transducer unit or an image sensor unit in accordance with this invention has the similar layer configuration to the semiconductor device described above with the only exception that the conductor region is formed by a transparent conductive material such as tin oxide ($SnO_2$).

In the above mentioned layer configuration, when the charge source region covered by the charge storage region and further covered by the transparent conductor region is irradiated with light, the charge storage region can be filled with electric charges, resultantly changing the capacity of the capacitor. Due to the same function as is effective for the above described memory cell, this change in capacity can be utilized to memorize information given in the form of light. The information reading procedure is the same as that mentioned above for the memory cell. Namely, when a voltage pulse signal with the polarity identical to the conductivity of the charge source region is applied to the conductor region against the charge source region, a signal corresponding to the memory position is taken out.

To attain the third one of the above mentioned objects, a random memory device in accordance with this invention is provided with a plurality of semiconductor devices (memory cells) as described above, to constitute a matrix, whereby application of a voltage pulse signal with the polarity to pass carriers through the P-N junction contained in a specific memory cell toward the memory cell after addressing the memory cell, results in writing a piece of information in the specific memory cell, and application of a voltage pulse signal with the polarity reverse to that which was employed for writing information toward the memory cell after addressing a specific memory cell results in reading a piece of information memorized in the specific memory cell.

To attain the fourth one of the above mentioned objects, an image sensor in accordance with this invention is provided with a plurality of photoelectro transducer units or image sensor units described above to constitute a matrix, whereby irradiation of the image sensor with light results in memorizing a signal representing the amount of light irradiated to the image sensor and the procedure identical to that for reading information memorized in the memory device is effective to output a group of signals representing an image memorized in the photoelectro transducer units in the image sensor.

BRIEF DESCRIPTION OF THE DRAWINGS

This invention, together with its various features and advantages, can be readily understood from the following more detailed description presented in conjunction with the following drawings, in which.

DETAILED DESCRIPTION OF THE PREFERRED EMBODIMENTS

With reference of FIGS. 1 through 4, an example of the steps for production of and the arrangement and configuration of each element of a random access memory cell in accordance with this invention will be described below, wherein the random access memory cell is produce on an N-type silicon semiconductor substrate.

The beginning portion of the production steps has two alternatives. Therefore, the steps for the two alternatives will be separately described for the beginning portion.

In the first alternative, the first step is to grow a silicon nitride ($Si_3N_4$) layer on the entire top surface of the N-type silicon substrate.

The second step is to employ a photo lithography process for removing the silicon nitride layer from the substrate surface except on an area where a charge storage region is to be produced.

The third step is to selectively oxidize the substrate employing the remaining silicon nitride layer as a mask. As a result, a field silicon dioxide ($SiO_2$) layer with the approximate thickness of 1 through 2 micro meters is produced on the top surface of the substrate except on the area where a charge storage region is to be produced.

After removing the silicon nitride mask employed for the selective oxidation described above, an ion implantation process is employed to introduce acceptor impurities such as boron (B) selectively in a specific area of the substrate to produce a charge storage rregion. This is the fourth step.

In the second alternative, the first step is to employ a photo lithography process to produce an opening in a photo resist film coated on a substrate. The opening is produced on the area where a charge storage region is to be produced.

The second step is to employ an ion implantation process to introduce acceptor impurities such as boron (B) employing the photoresist film as a mask.

After coating a silicon nitride layer on the entire surface of the substrate, a so-called lift off process is employed to remove the silicon nitride layer together with the photoresist film from the area of the substrate in which the impurities were not introduced during the above described ion implantation process. This is the third step.

The fourth step is to produce a field silicon dioxide layer on the area of the substrate from which the silicon nitride layer together with the photoresist film was removed during the above described step. The field silicon dioxide layer is formed by selective oxidation using the remaining silicon nitride layer as a mask. Therefore, the field silicon dioxide layer is not fabricated on the area of the substrate in which the impurities were introduced. Thereafter, the silicon nitride layer is entirely removed.

Figure 1:
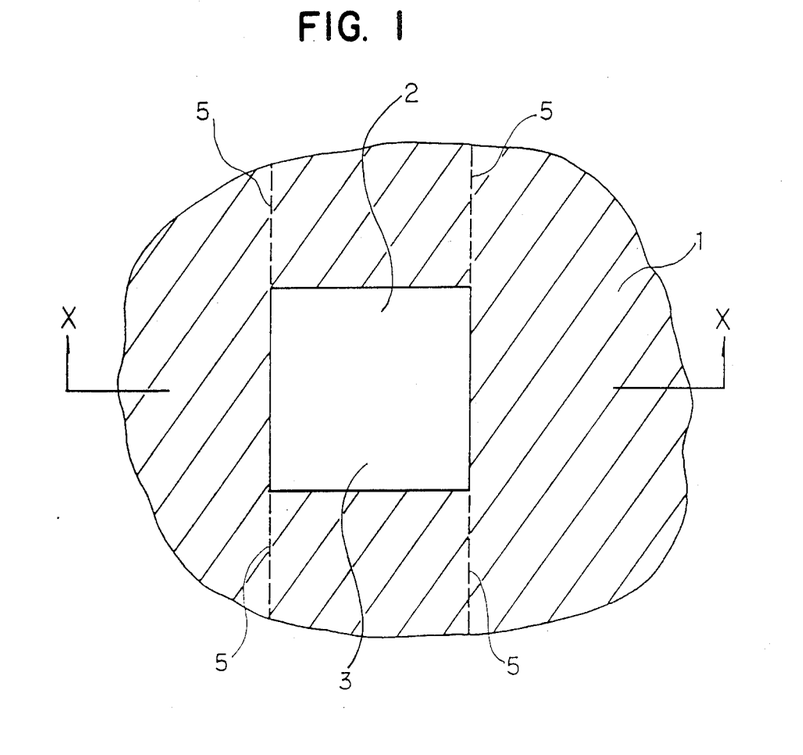
FIGS. 1 and 2 show respectively a plan view of a semiconductor device in accordance with this invention and a cross-sectional view of the same taken along the line X—X.
Figure 2:
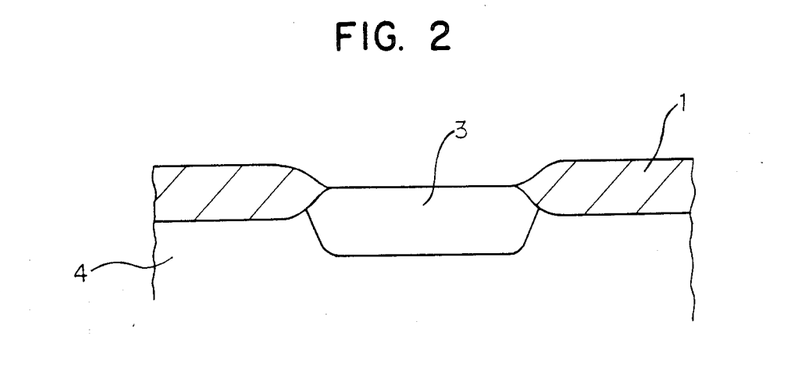

FIGS. 1 and 2 respectively show a plan view and a cross-sectional view of a substrate, after the fourth step is finished. Referring to the same figures, the reference numeral 1 shows a field silicon dioxide layer grown on an N-type silicon substrate 4. The reference numeral 3 shows a P-type region which constitutes a charge source region. It is noted that the broken lines 5 show the external boundaries of the buried conductor zones 10 which connect the charge source region 3 and the terminal (not shown) or the charge source regions 3 with each other in the case where plural charge source regions are provided on one chip. The buried conductor zones 10 are preferably formed as P-type regions which are united with the charge source regions 3 as a continuous belt. It is further noted that the charge storage region 2 and the charge source region 3 overlap each other in the plan view.

The fifth step is to introduce donor impurities, such as arsenic (As), just on the selected surface portion of the charge source region 3 into the depth of 1-2 $\mu$m preferably by employing an ion implantation process. As a result, a P-N junction is formed above the selected regions of the charge source region 3.

The sixth step is to form a thin silicon dioxide layer on the entire wafer surface with the approximate thickness of 1,000 Å. This silicon dioxide layer is shown in FIG. 4 by reference numeral 1'.

Figure 3:
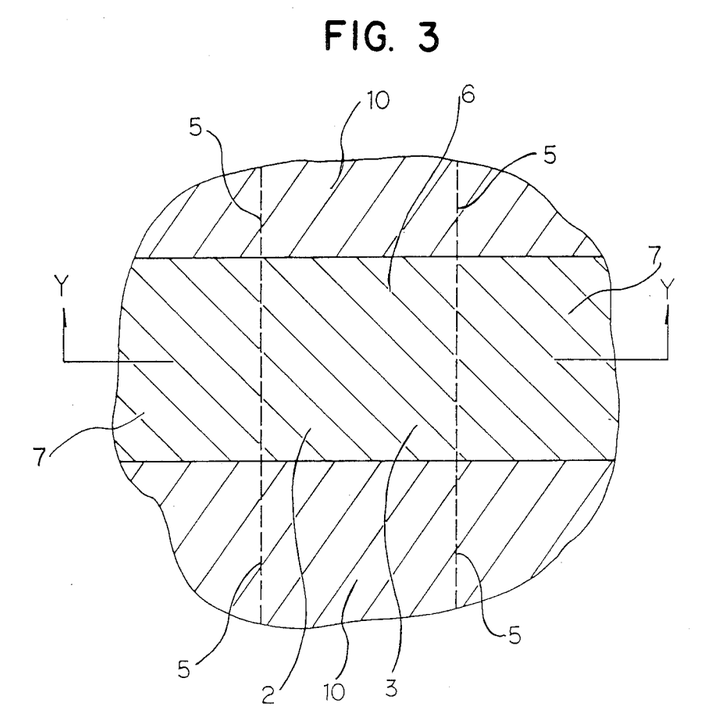
FIGS. 3 and 4 show respectively a plan view of a completed semiconductor device in accordance with this invention and a cross-sectional view of the same taken along the line Y—Y.
Figure 4:
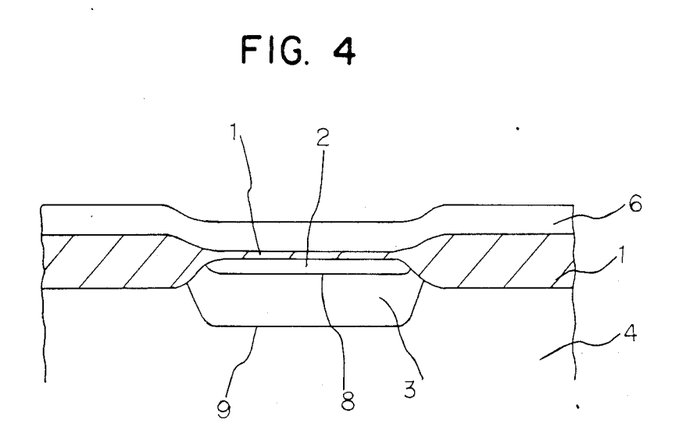

Referring to FIGS. 3 and 4, the seventh step is to form a conductor layer 6 on the silicon dioxide layers 1 and 1' and selectively at the area above the charge storage region 2 on the charge source region 3 and at the conductor zones which connect the conductor layer 6 and the terminal (not shown) or the conductor layers 6 with each other in the case where plural charge source regions are provided on one chip. Reference numeral 7 in FIG. 3 shows these conductor zones. Shown by reference numerals 8 and 9 in FIG. 4 are P-N junctions formed respectively between the P-type charge source region 3 and the N-type charge storage region 2 and the P-type charge source region 3 and the N-type silicon substrate 4.

Referring again to FIG. 4, an example of the function of the semiconductor device in accordance with this invention will be described below. As described earlier, a capacitor is constituted by the charge source region 3 and the conductor region 6 both of which are spaced by a thin dielectric layer 1'. Since the N-type charge storage region 2 is interleaved between the P-type charge source region 3 and the thin dielectric layer 1', a positive pulse signal a applied to the P-type charge source region 3 during the period in which a negative voltage is applied to the conductor region 6, causes the retention of some quantity of positive charge in or the transference of negative charge from the N-type charge storage region 2. Due to the P-N junction 8 the more positive charge is confined in the N-type charge storage region 2. This confined more positive charge decreases the capacity of the capacitor. This means the above mentioned positive pulse signal is memorized in the capacitor in the form of decreased capacity. This variation in capacity is allowed to correspond either to digital information memorized in the capacitor or is read out by applying a positive voltage pulse to the conductor layer 6 and a negative voltage pulse to the charge source region 3 hence detecting the capacitance charge through the output terminal. By means of detecting the signal, current is allowed to flow into the output terminal located at the end of the conductor region 6 due to the increased impedance of a bypass circuit which includes the capacitor.

Figure 5:
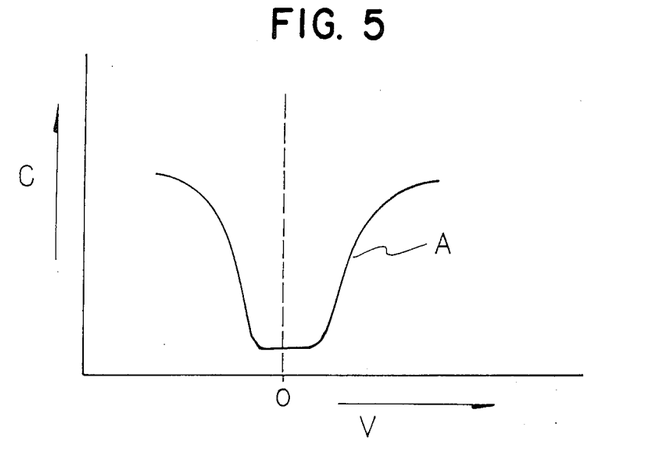
FIG. 5 shows a graph representing the relationship between the capacity (C) a metal-insulator-semiconductor layer configuration and the voltage (V) applied between the metal layer and the semiconductor layer.

This memory function is based on the following principle. In the metal-insulator-semiconductor layer configuration, the capacity (C) varies with the voltage (V) applied between the metal and the semiconductor depending on the charge redistribution as shown in the curve A of FIG. 5. Firstly, when the voltage (V) is large in the negative potential, an inversion layer occurs around the interface between the insulator and the semiconductor. As a result, the capacity (C) between them shows a large amount. Secondly, while the voltage (V) stays within intermediate value boundaries in the neighborhood of 0 V (zero volt), a depression layer spreads around the intersurface. As a result, the capacity (C) shows a small amount. Thirdly, when the voltage (V) is large in the positive potential, an accumulation layer occurs around the intersurface. As a result, the capacity (C) again shows a large amount. This means that the capacity (C) depends on the charge amount available around the surface. Therefore, if some quantity of charge can be confined in the neighborhood of the intersurface, namely in the surface regions, the capacity (C) of the capacitor is put under control. Further, if some quantity of charge to be confined in the neighborhood of the surface can be given by a pulse signal, the pulse signal is memorized in the form of a change in capacity of the capacitor.

In the layer configuration shown in FIG. 4, a positive pulse signal, for example, which is applied to the charge source region 3 against the conductor layer 6 supplies some quantity of charge to the charge storage region 2. This charge is confined in the charge storage region 2 due to the P-N junction 8 and readily changes the capacity of the capacitor constituted by the charge storage region 2 and the dielectric layer 1'. Thus, the pulse signal is memorized in the capacitor and the layer configuration shown in FIG. 4 functions as a memory cell. As described earlier, other means are available for writing information in the memory.

When reading information, a positive pulse signal, for example, is applied to the conductor layer 6 against the charge source region 3. Since the capacity (C) of the capacitor is small in the case where an amount of charge representing an information has been memorized in the memory cell, the impedance of the capacitor is large. Therefore, the positive signal applied to the conductor layer 6 against the charge source region 3 goes out of the output terminal (not shown) in the form of current. As described earlier, other means are available for reading information memorized in the memory cell.

From the above description, it has become clear that a memory cell consisting of only one capacitor of which the capacity is changed by a pulse signal is provided in accordance with this invention. It is noted that since the memory cell consists of only one capacitor, it requires an extremely small area of a chip. Moreover, it is noted that the memory cell has the nondestructive read out characteristic.

If in the above mentioned layer configuration, layer 6 is a transparent conductor layer 6, the configuration then functions as a photoelectro transducer or an image senser unit, because irradiation to the P-N junction between the charge source region 3 and the charge storage region 2 with lights causes some quantity of the positive and negative charged pairs, one type of which is to be stored in the charge storage region 2, to charge the capacity of the capacitor. This is the same function as that in which a piece of electric information is memorized. Therefore, this layer configuration provides a photoelectro transducer or an image sensor unit. The outstanding advantages of the image sensor unit are the same as for the memory cell described earlier. There is less area requirement and a non-destrudutive read out characteristic.

Figure 6:
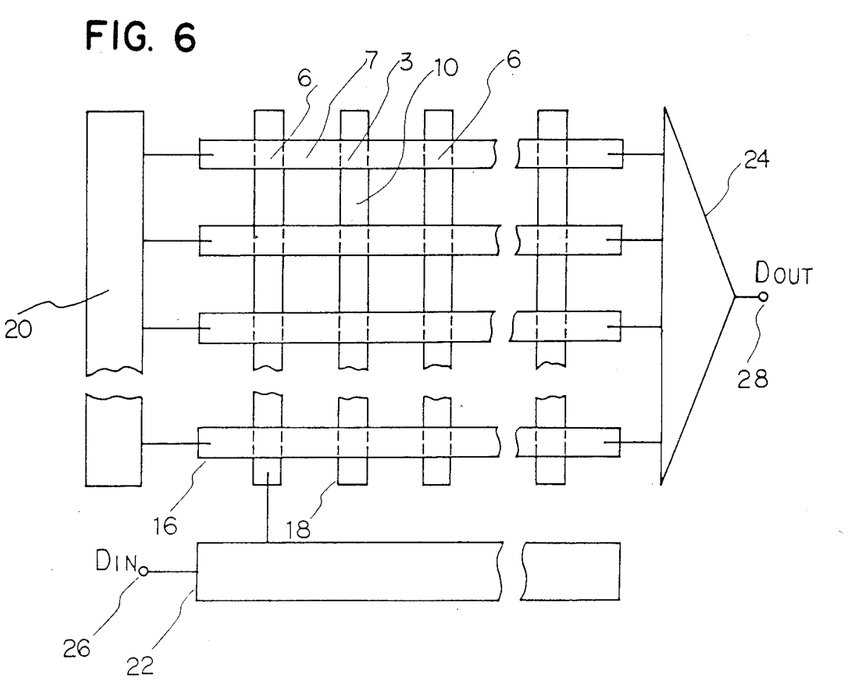
FIG. 6 shows a wiring diagram of a random access memory device in accordance with this invention.

With reference to FIGS. 6 and 7, the wiring and function of a random access memory device in accordance with this invention which utilizes a plurality of memory cells that have the layer configuration as shown in FIGS. 3 and 4 will be described below.

As best seen in FIGS. 3 and 6, the plural memory cells constitute a matrix. Viewing the matrix from above, the conductor layer 6 and the conductor zone 7 are placed one after the other to constitute each row which is in this case a bit line 16. Inside the chip, the charge source region 3 and the buried conductor region 10 are placed one after the other to constitute each column which is in this case a word line 18. Reference numeral 20 is a Y-address circuit which selects a specific bit line 16. Reference numeral 22 is an X-address circuit which selects a specific word line 18. Input signals are applied to the X-address circuit 22 through a signal input terminal 26 to supply charges to addressed charge storage regions 2. The information is read out from signal output terminal 28 through a sense amplifier 24.

Figure 7A:
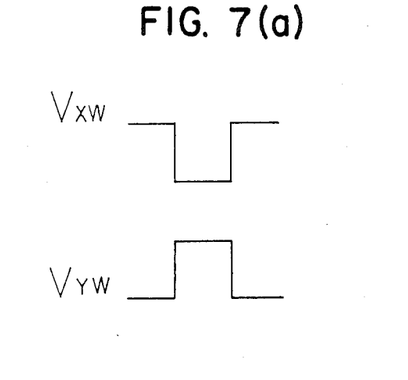
FIG. 7 shows a chart of signal pulses for writing information in and reading information from a random access memory device in accordance with this invention.
Figure 7B:
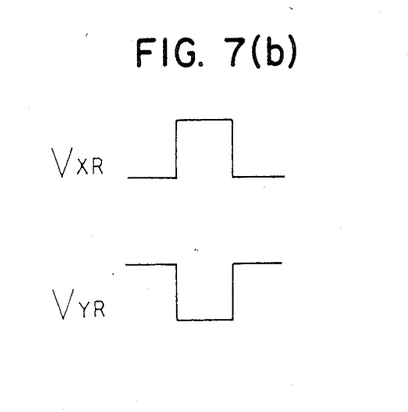

Referring to both FIG. 6 and FIGS. 7(a) and 7(b), the X-address circuit 22 and the Y-address circuit 20 are respectively applied with a voltage signal ($V_{XW}$) and a voltage signal ($V_{YW}$) such that $V_{XW}$ is greater than $V_{YW}$, for example, to write a piece of information in a memory cell located at the cross point of a selected word line 18 and a selected bit line 16. On the other hand, the X-address circuit 22 and the Y-address circuit 20 are respectively applied with a voltage signal ($V_{XR}$) and a voltage signal ($V_{YR}$) such that $V_{YR}$ is greater than $V_{XR}$, for example, to read a piece of information memorized in the memory cell located at the cross point of a selected word line 18 and a selected word line 16.

From the above description, it has become clear that a random access memory device which is allowed to enjoy various advantages, including non-destructive read out, less area requirement for the chip surface area and a much simplified control circuit is provided in accordance with this invention.

In a quite similar manner, an image sensor which can the same various advantages referred to above is also provided in accordance with this invention.

I claim:

1. A semiconductor device for connection to a sensing circuit, comprising:
    a substrate of material selected from the group of an insulator and a semiconductor having one conductivity type,
    a semiconductor charge source region having a conductivity type different from that of said semiconductor substrate and being formed on a selected portion of said substrate that said substrate defines a boundary of said charge source region,
    a semiconductor charge storage region having a conductivity type different from that of said charge source region and being formed on a selected portion of said charge source region and isolated from said substrate by said charge source region,
    a first insulating layer formed on said charge storage region,
    a second insulating layer formed on a portion of and defining a boundary of said charge source region and formed on said substrate such that said second insulating layer is thicker than said first insulating layer, and
    a conductor layer formed to cover at least said first insulating layer and operatively connectable to the sensing circuit, whereby said semiconductor device functions as a memory cell.

2. A semiconductor device defined in claim 1, wherein said conductor is formed of a transparent conductive material, and
    whereby said semiconductor device functions as a photoelectro transducer.

3. A semiconductor device comprising:
    a plurality of semiconductor devices, each of which is defined in claim 1.

4. A semiconductor device comprising:
    a plurality of semiconductor devices, each of which is defined in claim 2.

5. A memory cell comprising:
    a semiconductor device having a substrate of one conductivity type,
    a semiconductor charge source region having a conductivity type different from that of said semiconductor substrate and being formed on a selected portion of said substrate such that said substrate defines a boundary of said charge source region,
    a semiconductor charge storage region having a conductivity type different from that of said charge source region and being formed on a selected portion of said charge source region and isolated from said substrate by said charge source region,
    a first insulating layer formed on said charge storage region,
    a second insulating layer formed on a portion of and defining a boundary of said charge source region and formed on said substrate such that said second insulating layer is thicker that said first insulating layer, and
    a conductor layer formed to cover at least said first insulating layer.

6. A photoelectro transducer comprising:
    a semiconductor device having
    a substrate of one conductivity type,
    a semiconductor charge source region having a conductivity type different from that of said semiconductor substrate and being formed on a selected portion of said substrate such that said substrate defines a boundary of said charge source region,
    a semiconductor charge storage region having a conductivity type different from that of said charge source region and being formed on a selected portion of said charge source region and isolated from said substrate by said charge source region,
    a first insulating layer formed on said charge storage region,
    a second insulating layer formed on a portion of and defining a boundary of said charge source region and formed on said substrate such that said second insulting layer is thicker than said first insulating layer, and
    a transparent conductor layer formed to cover at least said first insulating layer.

7. A memory device comprising:
    a sensing circuit;
    a matrix of a plurality of memory cells, each memory cell being a semiconductor device having
    a substrate of one conductivity type,
    a semiconductor charge source region having a conductivity type different from that of said semiconductor substrate and being formed on a selected portion of said substrate such that said substrate defines a boundary of said charge source region,
    a semiconductor charge storage region having a conductivity type different from that of said charge source region and being formed on a selected portion of said charge source region and isolated from said substrate by said charge source region,
    a first insulating layer formed on said charge storage region,
    a second insulating layer formed on a portion of and defining a boundary of said charge source region and formed on said substrate such that said second insulating layer is thicker than said first insulating layer, and
    a conductor layer formed to cover at least said first insulating layer and operatively connected to said sensing circuit.

8. A photoelectro transducer device comprising:
    a matrix of a plurality of transducers, each transducer being a semiconductor device having a substrate of one conductivity type,
    a semiconductor charge source region having a conductivity type different from that of said semiconductor substrate and being formed on a selected portion of said substrate such that said substrate defines a boundary of said charge source region,
    a semiconductor charge storage region having conductivity type different from that of said charge source region and being formed on a selected portion of said charge source region and isolated from said substrate by said charge source region,
    a first insulating layer formed on said charge storage region,
    a second insulating layer formed on a portion of and defining a boundary of said charge source region and formed on said substrate such that said second insulating layer is thicker than said first insulating layer, and
    a transparent conductor layer formed to cover at least one insulating layer.

9. The memory device of claim 7 further comprising buried conductor zones connecting said charge source regions of the plurality of semiconductor devices and positioned with the charge source regions one after the other to form a column of said matrix for defining a word line.

10. The memory device of claim 7 or 9 further comprising conductor zones connecting said conductor layers of the plurality of said semiconductor devices and positioned with said conductor layers one after the other to form a row of said matrix for defining a bit line.

11. The photoelectro transducer of claim 8 further comprising buried conductor zones connecting said charge source regions of the plurality of semiconductor devices and positioned with the charge source regions one after the other to form a column of said matrix for defining a word line.

12. The photoelectro transducer of claim 8 or 11 further comprising conductor zones connecting said conductor layers of the plurality of said semiconductor devices and positioned with said semiconductor conductor layers one after the other to form a row of said matrix for defining a bit line.

13. The device of claim 9, wherein said buried conductor zones have the same conductivity type of said semiconductor charge source regions.

14. The device of claim 11, wherein said buried conductor zone have the same conductivity type of said semiconductor charge source regions.

15. The device of claim 5, wherein said first insulating layer comprises a thin dielectric layer of approximately 1000 Å.

16. The device of claim 15, wherein said semiconductor charge source region and said semiconductor charge storage region are operatively connected to receive respective voltage signals, said thin dielectric layer, said semiconductor charge source region and said semiconductor charge storage region define a single capacitor wherein said charge stored in said capacitor varies in accordance with said voltage signals applied to said semiconductor charge source region and said semiconductor conductor layer.

17. The device of claim 6, wherein said first insulating layer comprises a thin dielectric layer of approximately 1000 Å.

18. The device of claim 17, wherein said semiconductor charge source region and said semiconductor charge storage region are operatively connected to receive respective voltage signals, said thin dielectric layer, said semiconductor charge source region and said semiconductor charge storage region define a single capacitor wherein said charge stored in said capacitor varies in accordance with said voltage signals applied to said semiconductor charge source region and said semiconductor conductor layer.

19. The device of claim 7, wherein said first insulating layer comprises a thin dielectric layer of approximately 1000 Å.

20. The device of claim 19, wherein said semiconductor charge source region and said semiconductor charge storage region are operatively connected to receive respective voltage signals, said thin dielectric layer, said semiconductor charge source region and said semiconductor charge storage region define a single capacitor wherein said charge stored in said capacitor varies in accordance with said voltage signals applied to said semiconductor charge source region and said semiconductor conductor layer.

21. The device of claim 8, wherein said first insulating layer comprises a thin dielectric layer of approximately 1000 Å.

22. The device of claim 21, wherein said semiconductor charge source region and said semiconductor charge storage region are operatively connected to receive respective voltage signals, said thin dielectric layer, said semiconductor charge source region and said semiconductor charge storage region define a single capacitor wherein said charge stored in said capacitor varies in accordance with said voltage signals applied to said semiconductor charge source region and said semiconductor layer.

* * * * *

UNITED STATES PATENT AND TRADEMARK OFFICE
CERTIFICATE OF CORRECTION

PATENT NO. : 4,571,607
DATED : February 18, 1986
INVENTOR(S) : Togei

It is certified that error appears in the above-identified patent and that said Letters Patent is hereby corrected as shown below:

Fig. 7(a), "  " should be --  --;
"  " should be --  --.
Fig. 7(b), "  " should be --  --;
"  " should be --  --.
Column 2, line 53, after "random" insert --access--.
Column 7, line 15, after "substrate" insert --such--; (first occurrence)
line 62, "that" should be --than--.

Signed and Sealed this

Twenty-ninth Day of July 1986

[SEAL]

Attest:

DONALD J. QUIGG

Attesting Officer

Commissioner of Patents and Trademarks